United States Patent [19]

Tocci

[11] 4,384,344
[45] May 17, 1983

[54] LAYOUT FOR SINGLE LEVEL BLOCK ACCESS CHIP

[75] Inventor: Leonard R. Tocci, Mission Viejo, Calif.

[73] Assignee: The United States of America as represented by the Secretary of the Air Force, Washington, D.C.

[21] Appl. No.: 332,784

[22] Filed: Dec. 21, 1981

Related U.S. Application Data

[63] Continuation of Ser. No. 863,119, Dec. 22, 1977, abandoned.

[51] Int. Cl.³ ............................................. G11C 19/08
[52] U.S. Cl. .................................................... 365/16
[58] Field of Search ..................... 365/15, 16, 19, 20, 365/21, 13

[56] References Cited

U.S. PATENT DOCUMENTS

| | | | |
|---|---|---|---|
| 3,832,701 | 8/1974 | Bobeck et al. | 365/15 |
| 3,921,156 | 11/1975 | Yoshimi | 365/15 |
| 4,075,708 | 2/1978 | Chen | 365/15 |
| 4,075,709 | 12/1978 | Chen et al. | 365/12 |
| 4,094,005 | 6/1978 | Chen | 365/16 |

OTHER PUBLICATIONS

IBM Technical Disclosure Bulletin–vol. 17, No. 5, Oct. 1974, p. 1535.

*Primary Examiner*—James W. Moffitt
*Attorney, Agent, or Firm*—Donald J. Singer; Bernard E. Franz

[57] ABSTRACT

An improved layout for single level, block access, magnetic bubble domain chips is provided. In the improved layout, single level devices and conductors are provided. The improvement resides primarily in utilizing conductors which are arranged in a straight-line configuration with the magnetic bubble domain propagation paths arranged in a meandering configuration. This arrangment is contrary to existing techniques and permits enhanced operation of the magnetic bubble domain system.

4 Claims, 4 Drawing Figures

REPLICATE
PHASE
DIAGRAM
INPUT OR OUTPUT
SWITCH

TRANSFER
PHASE
DIAGRAM
INPUT OR OUTPUT
SWITCH

LAYOUT FOR SINGLE LEVEL BLOCK ACCESS CHIP

The invention herein described was made in the course of or under a contract or subcontract thereunder, with the Air Force.

This is a continuation of application Ser. No. 863,119, filed Dec. 22, 1977, now abandoned.

BACKGROUND OF THE INVENTION

1. Field of the Invention

This invention is directed to magnetic bubble domain device systems, in general, and to an improved layout thereof, in particular.

2. Prior Art

Magnetic bubble domain device systems are known in the art. Various and sundry arrangements of such systems are also known. In addition, it is known to be used either one level systems or two level systems. In any such systems, magnetic bubble domain propagation paths are provided along with electrical signal conductors which are used for active (as opposed to passive) switching or other similar operations. In most of the known systems, the resistance produced by the conductor associated with the active devices is quite high and increases the power utilized by the system which contributes to thermal variations on the chip. In addition high resistance can require drivers with voltage levels higher than desirable in practical memory systems. The conductor resistance can be reduced by decreasing the conductor length or increasing its width as well as reducing or removing any bends corners and the like in the conductor. Moreover, it is highly desirable to eliminate conductor crossovers which are found in many two level active switches fabricated by non-planar processing techniques.

In general, in two-level type block switches and chip layouts, the conductor path for the active devices meanders across the chip surface. For example, the conductor paths meander back and forth between the minor loops and the major track or tracks in order to be applied to the switches therebetween. In order to reduce the disadvantageous effects of the two level type conductor, judicious design can be utilized. That is, the conductor can be arranged so as to include careful fabrication, careful sloping of conductor walls and/or by switching only alternate bits in the device pattern. However, these approaches cause the chips to be more expensive to fabricate.

In one-level switches, the conductor path is, typically, either permalloy or a multilayer composite one layer of which is permalloy (i.e. magnetic). This layer of magnetic material causes the design of single level switches to be somewhat difficult, especially in the regions outside of the propagation path. In this arrangement, a meandering type conductor in single-level devices has relatively high resistance because of long conductor paths and the large number of corners in the path. In co-pending application Ser. No. 628,293, now U.S. Pat. No. 4,079,359. Compact Transfer Replicate Switch for Magnetic Single Wall Domain Propagation Circuits, by I. Gergis, it has been suggested that the conductor path outside the active area can be removed or replaced by a non-magnetic conductor. This approach has the advantage of retaining a single high resolution mask while the magnetic film problems can be removed. However, an additional gross alignment step is required in the processing which renders the process relatively more expensive and time consuming.

PRIOR ART STATEMENT

The most pertinent prior art known to applicant is listed herewith.

U.S. Ser. No. 820,073, now U.S. Pat. No. 4,128,896; One Level Switch for Magnetic Bubble Domain Devices, George et al. This application relates to one level switches using pick-ax (half-disk) elements.

U.S. Pat. No. 4,079,359; Compact Transfer Replicate and Method of Making Same; Gergis. This patent is directed at a process for making magnetic bubble domain devices.

"Major-Minor Loop, Single-Level-Masking Bubble Chip", Kryder et al., presented at Intermag Conference, Los Angeles, June 1977 (currently unpublished). This publication relates to a method of fabricating a major/minor magnetic bubble domain system. FIG. 7 shows switches with a straight conductor segment.

"The Y-Bar Switch—A Single-Level-Masking Switch", Cohen et al., IEEE Transactions on Magnetics, Vol. Mag-13, No. 5, September 1977, pp. 1264–1266. FIG. 3 shows a switch with a straight conductor segment.

U.S. Pat. No. 3,832,701; Transfer Circuit for Single Wall Domains; Bobeck. Certain figures of this patent show straight conductor segments but do not include meandering propagation paths.

SUMMARY OF THE INVENTION

This invention is directed at an improved layout arrangement for single level, block access, magnetic bubble domain chips. The improvement comprises novel layout arrangements wherein the conductors for active devices in magnetic bubble domain systems are arranged in straight lines while the propagation path (or paths) including major and minor tracks and the like are arranged in a meandering configuration. Typically, this arrangement is opposite to the arrangement generally known in the art.

DESCRIPTION OF THE PREFERRED EMBODIMENT

Figure 1:
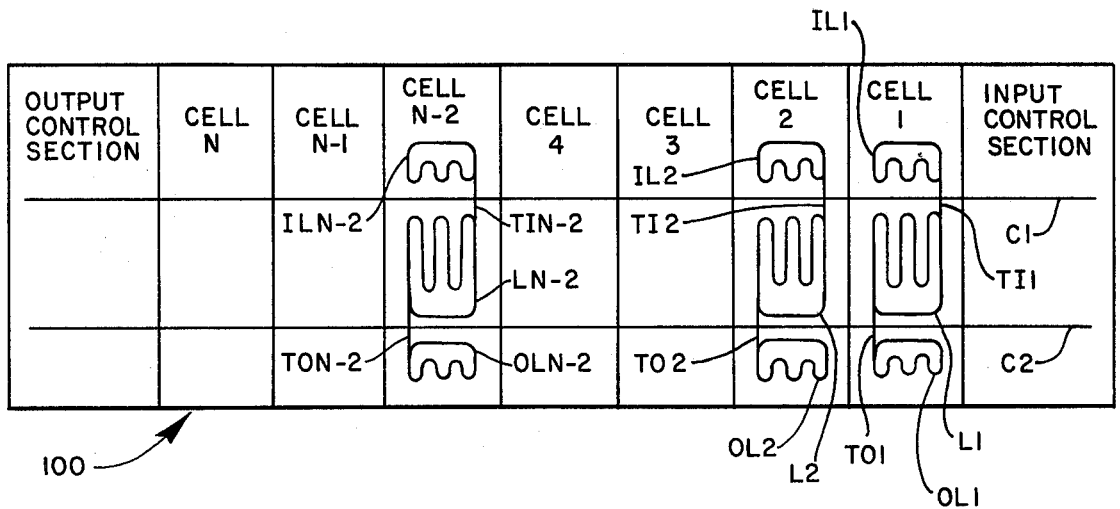
FIG. 1 is a schematic representation of a single level, block access, magnetic bubble domain chip layout in accordance with the instant invention.

Referring now to FIG. 1, there is shown a schematic representation of a magnetic bubble domain chip layout in accordance with the instant invention. Chip 100 is a standard magnetic bubble domain chip using garnet substrates and garnet films of a suitable type. Deposited on chip 100 are various elements including conductors C1 and C2. In this embodiment it is clear that conductors C1 and C2 (as well as any other conductors which may be desired) are relatively straight-line conductors which extend from left to right (or vice versa). Of course, the concept applies to conductors which extend from the top to the bottom of chip 100. After the conductors have been assigned the "straight" configuration, the magnetic bubble domain devices including switches and the like are arranged in meandering loops such as loops L1, L2, LN−2 and so forth. The various loops are arranged to produce cells in the bubble domain system. In the system shown, there are N cells identified as cell 1, cell 2, . . . cell N.

Each of the cells includes one of the meandering paths L1, L2, or the like. These loops represent storage loops in memory devices or minor loops in major/minor loop systems. Other loops such as output loop OL1, OL2 and input loops IL1, IL2 are also associated with the respective cells. The input and output loops, which are also meandering loops, are connected to the operating or storage loops (paths) through a suitable switching apparatus such as a transfer switch. Transfer-in switches TI1, TI2 and the like or transfer-out switches T01, T02 and the like are schematically represented and function to interconnect the respective loops. In accordance with known techniques, the input control section and output control section can include generators, annihilators, detectors and the like. In addition, control arrangements can be provided wherein control signals or pulses can be applied to conductors C1 and/or C2 to effect the appropriate transfer of information between the respective loops via the associated switches.

Figure 4:
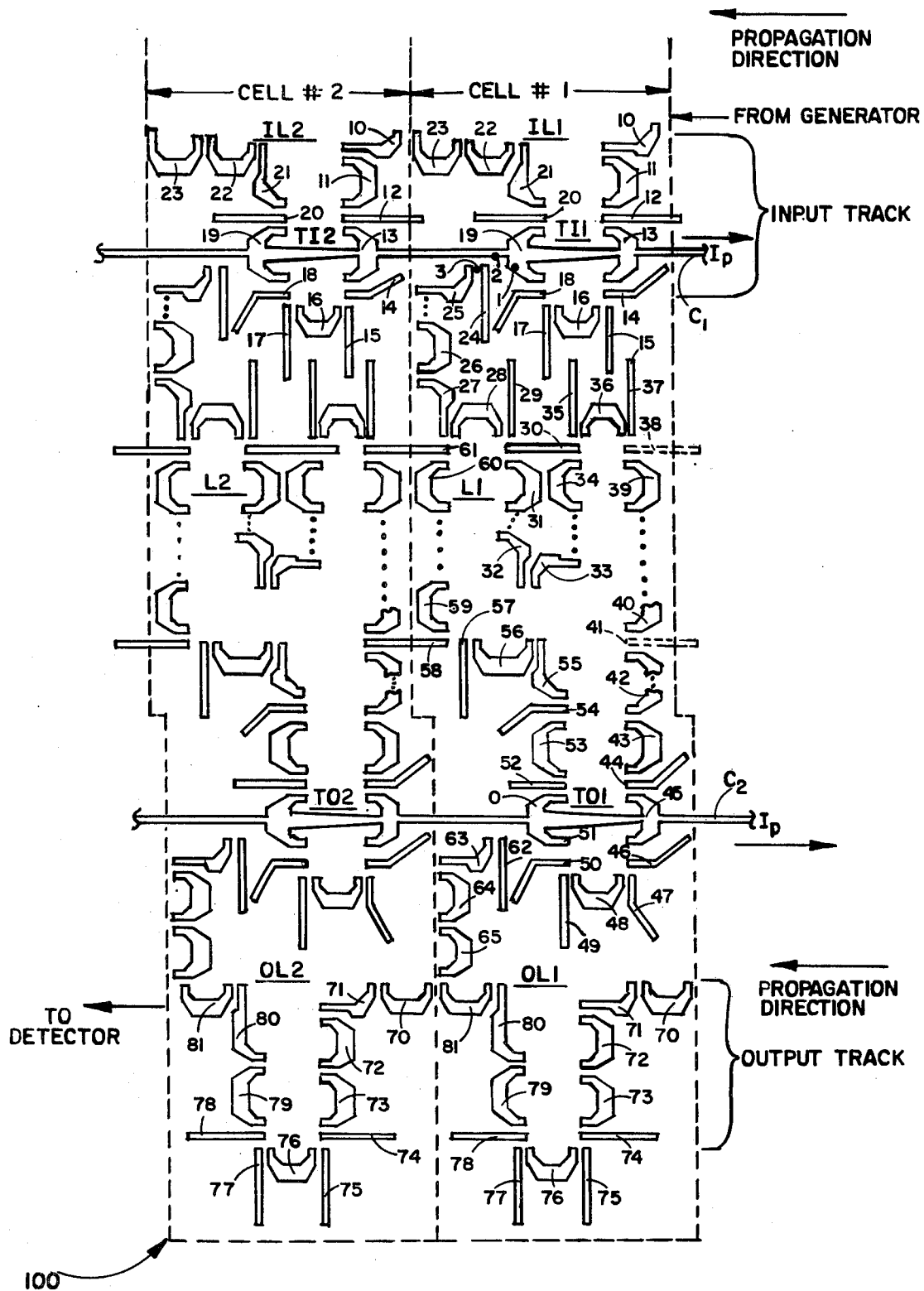
FIG. 4 is a detailed schematic representation of the chip layout in accordance with the instant invention and shown in FIG. 1.

Referring now to FIG. 4, there is shown a detailed representation of an illustrative arrangement for implementing the instant invention. In FIG. 4, the illustration is related only to cells 1 and 2 for convenience. However, the description is pertinent to other cells. In addition, details such as detectors, generators, and the like are omitted for clarity. In FIG. 4, it is clear that conductors C1 and C2 are substantially straight line configuration devices. The conductors intersect, or are formed as part of, so-called pick-ax type switches which are known in the art. Such pick-ax switches are described in co-pending application Ser. No. 820,073, entitled "One Level Switch for Magnetic Bubble Domain Devices" by George et al. The pick-ax switches are associated with gap tolerant devices of the type shown and described in the co-pending application of George et al. entitled "Gap Tolerant Bubble Domain Propagation Circuits", now U.S. Pat. No. 4,079,461. The configurations of switches TI1, TI2, T01, and T02 as well as the gap tolerant devices are known in the art and form no portion of the invention described herein, per se.

In the embodiment shown, the input path comprises input loops IL1, IL2 and other similar paths not specifically shown in FIG. 4. In particular, the input path in each cell comprises elements 10 through 23, inclusive, as well as switch TI1. The elements 23 and 10 in adjacent cells are arranged to communicate to provide propagation from one cell to the next. Likewise, output track or paths OL1 and OL2 each comprise elements 70 through 81, inclusive. Elements 81 and 70 in adjacent cells are arranged to provide propagation to complete the track path.

Thus, in typical operation of the input path a bubble supplied to element 10 in cell 1 propagates through element 23 in cell 1. A bubble at element 23 is then propagated to element 10 in cell 2 and propagated through the path to element 23 and so forth. Similarly, in the output track, a bubble is supplied to element 70 and propagated through to element 81 from whence it is transferred to element 70 in cell 2 and propagated through to element 81, and so forth.

Minor loop L1 comprises elements 27 through 60, inclusive. It can be readily seen that this loop meanders around the cell and includes switch T01. The intermediate propagation path which interfaces between the input loop and the minor loop comprises elements 24, 25, 26. Similarly, the interface loop which interfaces between the minor loop and the output loop comprises elements 62, 63, 64 and 65.

Figure 3:
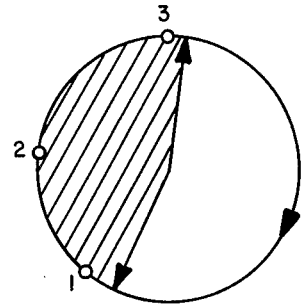

In typical operation, a bubble propagating along the input track moves from element 10 through to element 23 (in numerical sequence) in each cell. However, when a transfer is to occur, a pulse $I_p$ is applied along conductor C1 in accordance with the phase diagram shown in FIG. 3. In this instance, the bubble is propagated through the path in the normal manner until it reaches element 19 at which point it follows the bubble track indicated by the small dots 1, 2, and 3. In particular, the bubble propagates around the periphery of element 19 but is blocked by the current $I_p$. The bubble moves along the edge of conductor C1 until it is attracted to the poles produced at elements 24 and 25 in response to rotating field $H_R$. At this point, the bubble has been transferred from input loop IL1 to minor loop L1, and then propagates through elements 24, 25, 26, 27, 28 and so forth in the usual manner. Of course, when the bubble reaches element 28, it is propagating in minor loop L1 and continues to element 61 and back to element 28 for recirculation.

The transfer-out operation is similar. That is, the bubble in loop L2 proceeds from element 45 to element 51 in the usual manner. However, with a transfer-out operation, the control signal $I_p$ is applied to conductor C2. Thus, the bubble propagating around the periphery of element 51 is blocked by the field at conductor C2 and moves therealong until it is attracted by the magnetic poles at the ends of elements 62 and 63. From there, the bubble propagates to elements 64 and 65 until it is attracted to the ends of elements 65 and 70 of loops OL1 and OL2, respectively. The bubble then propagates through loop OL2 in the standard manner.

Figure 2:
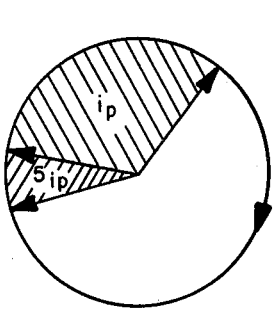
FIGS. 2 and 3 are phase diagrams for switches shown, in detail, in FIG. 4.

The phase diagram shown in FIG. 2 illustrates the application of signal $I_p$ to conductors C1 or C2 in order to provide a replica function. That is, a spike signal of amplitude 5 $I_p$ is supplied to cut the bubble to sever same into two different bubbles while the signal $I_p$ is applied to provide a blocking function to the second bubble. Each bubble will then propagate separately through its respective path.

The transfer and replicate operations are relatively standard in the art and are described in co-pending application to Gergis et al.

As shown in FIG. 4, the pattern of the loop, especially loop L1, is repeated in the chip arrangement. The loops are spaced approximately 8 bits apart with respect to the input or output tracks. However, the access time in this arrangement is degraded by a factor of only 2 (rather than 8) inasmuch as the minor loops (L1, L2 and the like) are composed of only two simple loops in series as a result of meandering major tracks such as input or output tracks.

Thus, there is shown and described a preferred embodiment of the instant invention which represents an improvement in single-level, block access, magnetic bubble domain chip layout. As noted, the conductors for active devices or components are designed to be a straight conductor which permits improvement in reduction of the resistance presented by such conductors. The resistance is reduced by the conductor length and the corners required in a standard meandering conductor configuration known in the art. Conductors are permitted to be straight inasmuch as the propagation path or loops are arranged in a meandering configuration without degradation of the system or system operation. The specific arrangement of the device is shown in an illustrative chip layout. However, this arrangement is illustrative only and is not intended to be limitative. Rather, the scope of the invention is limited only by the claims appended hereto.

Having thus described the preferred embodiment of the invention, what is claimed is:

1. A single level magnetic bubble chip comprising:
    a plurality of similar cells;
    at least first and second conductors each having a straight-line configuration across said chip crossing all of said cells;
    an input propagation path meandering across said chip crossing all of said cells, including two crossings of said first conductor on each cell;
    each cell having a closed loop propagation path for storing recirculating magnetic bubble domains therein, said closed loop propagation path meandering on its cell, including twice crossing said second conductor;
    an output propagation path meandering across said chip crossing all of said cells, including two crossings of said second conductor on each cell;
    each cell having a first active component associated with said first signal conductor at said two crossings of said first conductor to control bubble domain propagation through said first propagation path, said first active component comprising first switch means for transferring magnetic bubble domains from said input path to said closed loop path in response to a signal on said first signal conductor; and
    each cell further having a second active component associated with said second signal conductor at said two crossings of said second conductor to control bubble domain propagation through said closed loop path, said second active component comprising second switch means for transferring magnetic bubble domains from said closed loop path to said output propagation path in response to a signal on said second signal conductor.

2. The magnetic bubble domain chip recited in claim 1, wherein
    said first switch means includes at least one half-disk element in conjunction with said first signal conductor.

3. The magnetic bubble domain chip recited in claim 2, wherein
    said second switch means includes at least one half-disk element in conjunction with said second signal conductor.

4. The magnetic bubble domain chip recited in claim 1 or 3, wherein
    said first signal conductor is integrally formed with said first active component in a single level device; and
    said second signal conductor is integrally formed with said second active component in a single level device.

* * * * *